United States Patent
Ochiai et al.

(10) Patent No.: US 8,675,702 B2
(45) Date of Patent: Mar. 18, 2014

(54) LASER MODULE

(75) Inventors: Takahide Ochiai, Hamamatsu (JP);
Naota Akikusa, Hamamatsu (JP);
Tadataka Edamura, Hamamatsu (JP);
Hirofumi Kan, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 13/256,657

(22) PCT Filed: May 21, 2010

(86) PCT No.: PCT/JP2010/058660
§ 371 (c)(1),
(2), (4) Date: Sep. 15, 2011

(87) PCT Pub. No.: WO2011/021417
PCT Pub. Date: Feb. 24, 2011

(65) Prior Publication Data
US 2012/0014402 A1  Jan. 19, 2012

(30) Foreign Application Priority Data
Aug. 19, 2009 (JP) ................. 2009-190329

(51) Int. Cl.
*H01S 5/34* (2006.01)
(52) U.S. Cl.
USPC .......... 372/45.012; 372/43.01; 372/45.01
(58) Field of Classification Search
USPC .................................. 372/45.012
See application file for complete search history.

(56) References Cited

U.S. PATENT DOCUMENTS

| | | | |
|---|---|---|---|
| 7,531,803 B2 * | 5/2009 | Mittleman et al. | 250/341.1 |
| 2007/0116077 A1 * | 5/2007 | Farmer et al. | 372/50.12 |
| 2007/0237194 A1 * | 10/2007 | Shahine | 372/29.011 |
| 2010/0002739 A1 * | 1/2010 | Hu et al. | 372/45.01 |

FOREIGN PATENT DOCUMENTS

| | | |
|---|---|---|
| JP | 8-279647 | 10/1996 |
| JP | 2004-253782 | 9/2004 |
| JP | 2008-543101 | 11/2008 |

OTHER PUBLICATIONS

Wanke et al., "Terahertz quantum cascade laser integration with on-chip micromachined rectangular waveguides", Proc. of SPIE, vol. 7215, Feb. 2009.*
Danylov et al., "Transformation of the multimode terahertz quantum cascade laser beam into a Gaussian, using a hollow dielectric waveguide", Applied Optics, vol. 46, No. 22, pp. 5051-5055, Aug. 2007.*

* cited by examiner

*Primary Examiner* — Xinning Niu
(74) *Attorney, Agent, or Firm* — Drinker Biddle & Reath LLP (57) ABSTRACT

A laser module LM is provided with a quantum cascade laser 1, a tubular member 5, and an infrared detector 7. The tubular member 5 has a pair of opening ends 5a, 5b and is arranged so that one opening end 5a is opposed to a face 1b opposed to an emitting end face 1a of the quantum cascade laser 1. The infrared detector 7 is arranged so as to be opposed to the other opening end 5b of the tubular member 5. Light emitted from the face (rear end face) 1b opposed to the emitting end face (front end face) 1a of the quantum cascade laser 1 is guided inside the tubular member 5 to enter the infrared detector 7, and then is detected.

5 Claims, 12 Drawing Sheets

| SAMPLE | GAUGE | INSIDE DIAMETER (mm) | OUTSIDE DIAMETER (mm) |
|--------|-------|----------------------|------------------------|
| S1 | G13 | 1.99 | 2.41 |
| S2 | G14 | 1.69 | 2.11 |
| S3 | G15 | 1.45 | 1.81 |
| S4 | G16 | 1.25 | 1.61 |
| S5 | G17 | 1.12 | 1.48 |
| S6 | G18 | 0.90 | 1.26 |
| S7 | — | — | — |

LASER MODULE

TECHNICAL FIELD

The present invention relates to a laser module with a quantum cascade laser.

BACKGROUND ART

A Quantum Cascade Laser (QCL) is known as a light source in the mid-infrared region of wavelengths of about 5 to 30 µm (e.g., cf. Patent Literature 1). The quantum cascade laser is a monopolar type device making use of electron transitions between subbands created in semiconductor quantum wells. The quantum cascade laser implements high-efficiency and high-output operation by cascade coupling of a stack of multiple active layers of semiconductor quantum well structure. Currently, continuous wave (CW) operation is achieved at room temperature (RT) in the wide wavelength band of 3.8 to 11.5 µm and examples of the quantum cascade lasers in practical use include pulse operation type quantum cascade lasers and CW (Continuous Wave) operation type quantum cascade lasers.

CITATION LIST

Patent Literature

Patent Literature 1: Japanese Patent Application Laid-open No. 8-279647

SUMMARY OF INVENTION

Technical Problem

Packages employed for ordinary quantum cascade lasers currently available in the market are, for example, CAN packages, butterfly packages, or HHL (High Heat Load) packages. However, the mid-infrared light requires hard alignment of an optical system thereof and none of the packages described above is provided with any function other than the laser oscillation and temperature control. For this reason, there are demands for realization of a module highly functionalized with a function such as monitoring of output and/or wavelength.

It is an object of the present invention to provide a laser module allowing implementation of high functionalization.

Solution to Problem

A laser module according to the present invention is one comprising: a quantum cascade laser; a tubular member having a pair of opening ends and arranged so that one opening end is opposed to a face opposed to an emitting end face of the quantum cascade laser; and an infrared detector arranged so as to be opposed to the other opening end of the tubular member.

In the laser module according to the present invention, the tubular member is arranged so that one opening end is opposed to the face opposed to the emitting end face of the quantum cascade laser and so that the other opening end is opposed to the infrared detector. For this reason, light emitted from the face opposed to the emitting end face of the quantum cascade laser propagates inside the tubular member to enter the infrared detector, and then is detected. Therefore, the light emitted from the quantum cascade laser is guided to the infrared detector, without use of any optical member requiring hard alignment. This results in enabling monitoring of the output, wavelength, etc. of the quantum cascade laser, and thereby achieving high functionalization of the laser module.

The tubular member may have a cross-sectional area set in the range of 1.23 to 2.24 mm². In this case, the quantity of the light guided inside the tubular member increases, and the light emitted from the quantum cascade laser is efficiently guided to the infrared detector. When the tubular member has a cylindrical shape, an inside diameter thereof is preferably set in the range of 1.25 to 1.69 mm.

The tubular member may be a 14-gauge to 16-gauge hollow needle. In this case, the quantity of the light guided inside the tubular member increases and the light emitted from the quantum cascade laser is efficiently guided to the infrared detector.

The tubular member may be comprised of stainless steel. In this case, the laser module is substantialized as an inexpensive one.

Advantageous Effect of Invention

The present invention provides the laser module achieving high functionalization.

DESCRIPTION OF EMBODIMENTS

The preferred embodiments of the present invention will be described below in detail with reference to the accompanying drawings. In the description, the same elements or elements with the same functionality will be denoted by the same reference signs, without redundant description.

Figure 1:
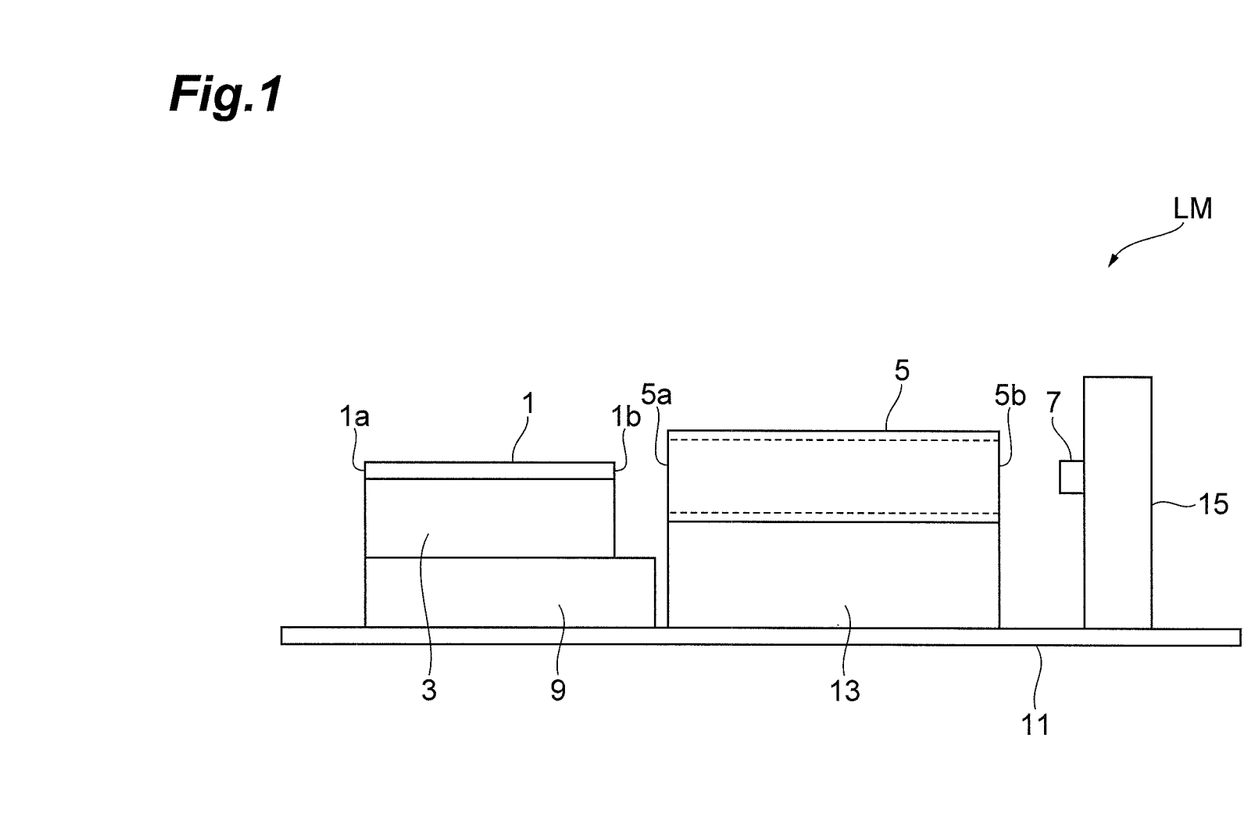
FIG. 1 is a side view showing a schematic configuration of a laser module according to an embodiment of the present invention.
Figure 2:
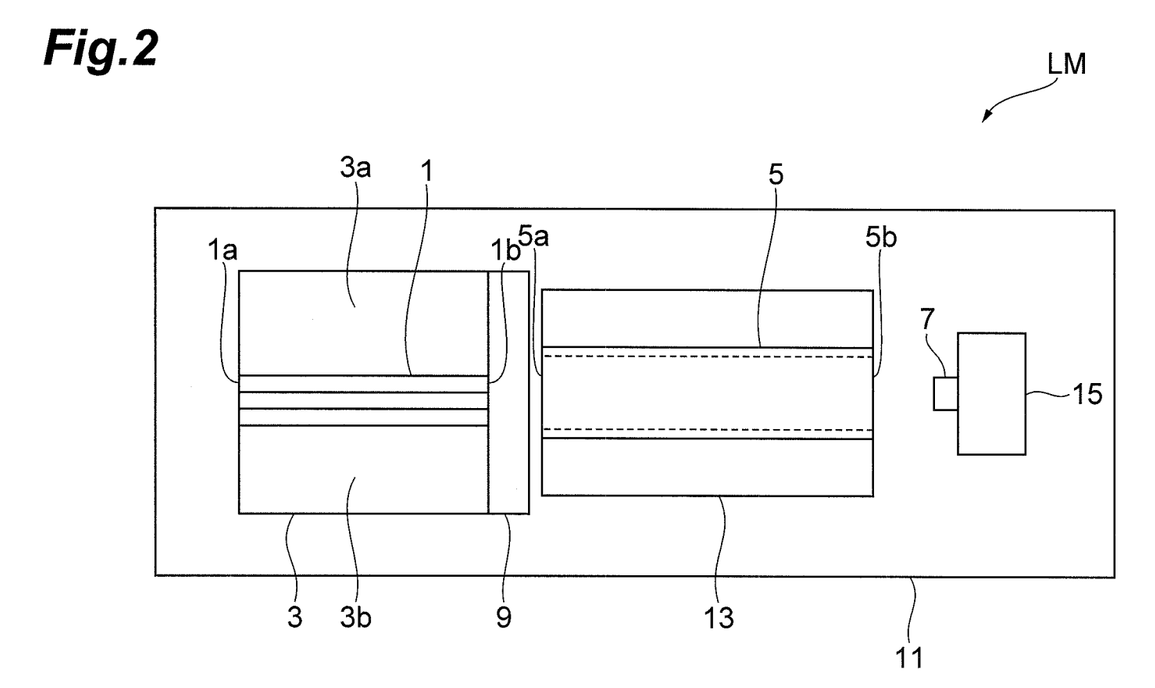
FIG. 2 is a plan view showing the schematic configuration of the laser module according to the embodiment of the present invention.

A configuration of laser module LM according to an embodiment of the present invention will be described with reference to FIGS. 1 and 2. FIG. 1 is a side view showing the schematic configuration of the laser module according to the present embodiment. FIG. 2 is a plan view showing the schematic configuration of the laser module according to the present embodiment. The laser module LM is provided with a quantum cascade laser 1, a submount 3, a tubular member 5, and an infrared detector 7.

The quantum cascade laser 1 is an optical waveguide type semiconductor laser device of a monopolar type that generates light by making use of intersubband electron transitions in a semiconductor quantum well structure. The quantum cascade laser 1 is constructed with a semiconductor substrate, and active layers formed on the semiconductor substrate. The quantum cascade laser 1 has a front end face 1a and a rear end face 1b opposed to each other. The front end face 1a and the rear end face 1b constitute an optical resonator. The resonator structure (front end face 1a and rear end face 1b) of the quantum cascade laser 1 can be formed by cleavage of the two end faces. The configuration and operation of the quantum cascade laser 1 are known in the technical field concerned (e.g., which are described in the aforementioned Patent Literature 1, and Japanese Patent Applications Laid-open No. 2004-247492, Laid-open No. 2005-039045, and Laid-open No. 2008-177366) and therefore no further detailed description will be given.

The quantum cascade laser 1 is mounted on the submount 3. The submount 3 is comprised of a metal or ceramic or other material and electrode pads 3a, 3b are arranged thereon. The quantum cascade laser 1 is arranged on the electrode pad 3a by die bonding using a solder or the like. Therefore, one electrode of the quantum cascade laser 1 is connected to the electrode pad 3a. The other electrode of the quantum cascade laser 1 is connected to the electrode pad 3b by wire bonding or the like. The submount 3 is mounted on a cooling device 9 such as TEC (Thermo-Electrical Cooler). The cooling device 9 is mounted on a fixing member 11.

When an electric current is allowed to flow in an appropriate direction in the quantum cascade laser 1, the quantum cascade laser 1 emits light from the front end face 1a and the rear end face 1b. In general, the light emitted from the front end face 1a of the quantum cascade laser 1 is used as output light from the quantum cascade laser 1. Namely, the front end face 1a is an emitting end face of output light.

The tubular member 5 has a pair of opening ends 5a, 5b. The tubular member 5 has a cylindrical shape and is made of stainless steel. The tubular member 5 is arranged on the rear end face 1b side of the quantum cascade laser 1 so that the opening end 5a is opposed to the rear end face 1b of the quantum cascade laser 1 and so that a center axis thereof coincides with the direction of the optical axis of the optical resonator composed of the front end face 1a and the rear end face 1b. The tubular member 5 is mounted on the fixing member 11 through a mounting member 13.

The inside diameter of the tubular member 5 is set in the range of 1.25 to 1.69 mm and the cross-sectional area of the tubular member 5 is set in the range of 1.23 to 2.24 mm². In the present embodiment, the inside diameter of the tubular member 5 is 1.25 mm, the cross-sectional area thereof is 1.23 mm², and the distance between the rear end face 1b and the opening end 5a is 0.5 mm. The length of the tubular member 5 is set to 8 mm.

The infrared detector 7 is a detector that can detect light in the mid-infrared region. The infrared detector 7 is arranged so as to be opposed to the opening end 5b of the tubular member 5. The infrared detector 7 to be used herein can be, for example, an MCT (Mercury Cadmium Telluride) detector with high sensitivity in the mid-infrared region. The infrared detector 7 is mounted on the fixing member 11 through a mounting member 15.

In the present embodiment, as described above, the tubular member 5 is arranged so that the opening end 5a is opposed to the rear end face 1b of the quantum cascade laser 1 and so that the opening end 5b is opposed to the infrared detector 7. For this reason, the light emitted from the rear end face 1b of the quantum cascade laser 1 propagates inside the tubular member 5 to enter the infrared detector 7, and then is detected. Therefore, the light emitted from the rear end face 1b of the quantum cascade laser 1 is guided to the infrared detector 7, without use of any optical member requiring hard alignment. As a result, the laser module LM becomes able to monitor the output, wavelength, etc. of the quantum cascade laser 1, thus accomplishing high functionalization of the laser module LM.

Incidentally, in order to monitor the output and wavelength, it is necessary to highly efficiently transmit the light emitted from the quantum cascade laser. The light in the mid-infrared region emitted from the quantum cascade laser suffers great loss in an optical fiber of quartz, plastics, or the like used in lasers applied for optical communication. For this reason, it is difficult to use these optical fibers in the optical system of the quantum cascade laser. A hollow fiber is known as an optical fiber to transmit the mid-infrared light, but this hollow fiber is expensive. Therefore, employment of the hollow fiber inevitably leads to increase in cost of the laser module.

In the laser module LM, the light from the quantum cascade laser 1 is guided by the tubular member 5 of stainless steel. In this case, the tubular member 5 to be used therein can be one of those commonly available in the market. As a consequence, the compact and inexpensive laser module LM can be substantialized without complexity of the optical system for monitoring the output, wavelength, etc. of the quantum cascade laser 1.

Figure 3:
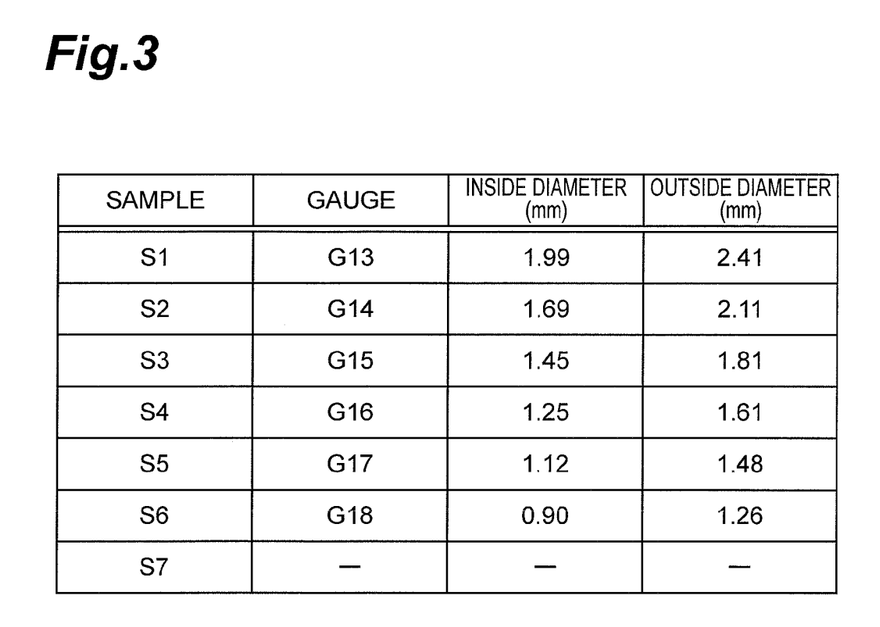
FIG. 3 is a chart showing G (gauge) of tubular members used in samples S1-S7.

The inventors conducted an experiment as described below, in order to clarify the relationship between the inside diameter (cross-sectional area) of the tubular member 5 and the output (optical output) of the infrared detector 7. Specifically, samples were prepared including a plurality of samples with different inside diameters of tubular member 5 (samples S1 to S6) and a sample without tubular member 5 (sample S7), and the optical output (mV) was measured for each of the samples. In the present experiment, the tubular members 5 used were hollow needles, particularly stainless steel pipes for syringe needles. Pipes for syringe needles are standardized and the standard of gauge (G) is used. FIG. 3 shows the gauges (G) of the tubular members 5 in the respective samples, i.e., the inside diameters and outside diameters. In the present experiment, the distance between the rear end face 1b and the opening end 5a was set to 0.5 mm, the length of the tubular member 5 was set to 8 mm, and the distance between the opening end 5b and the infrared detector 7 (light receiving part) was set to 2 mm.

Figure 4:
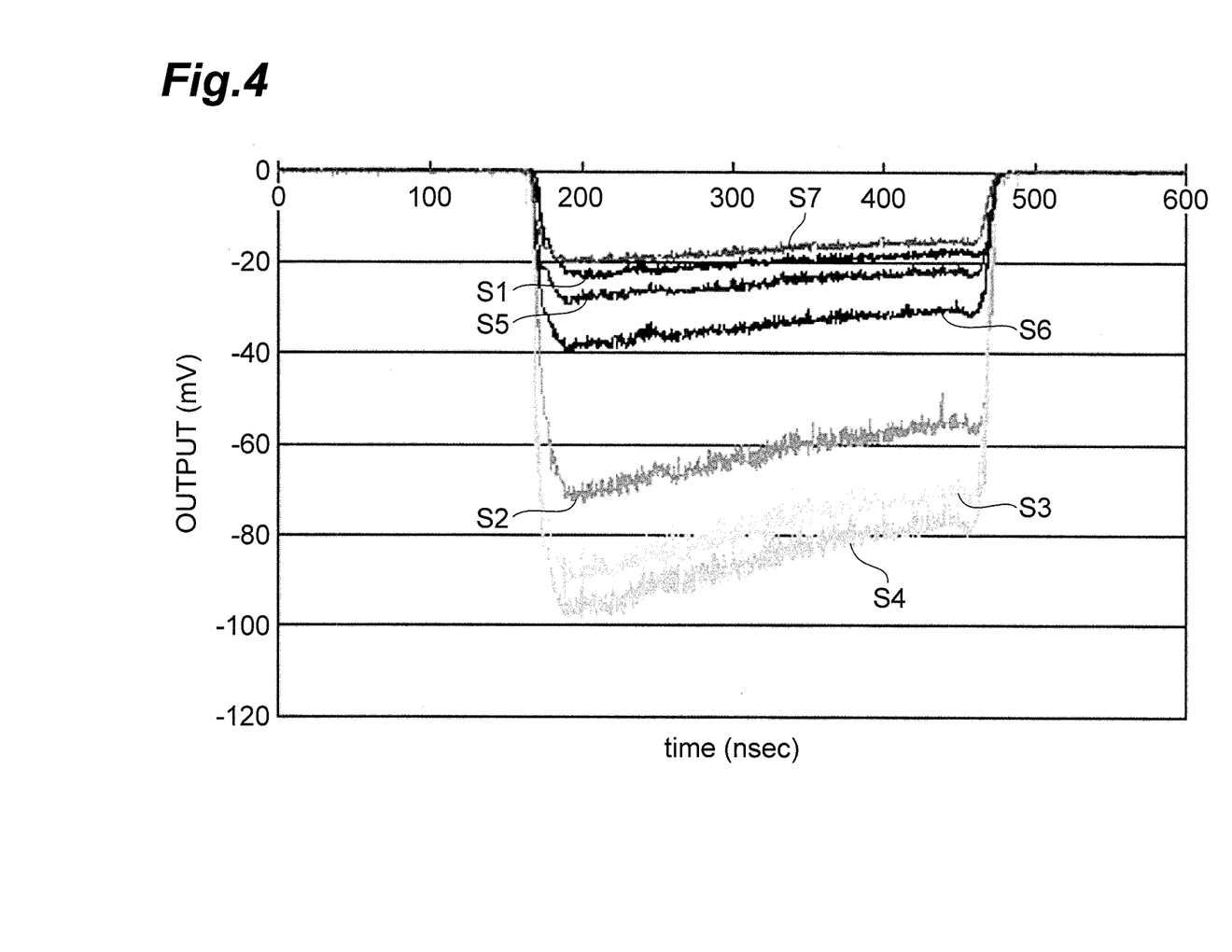
FIG. 4 is a graph showing the measurement results of optical output in samples S1-S7.
Figure 5:
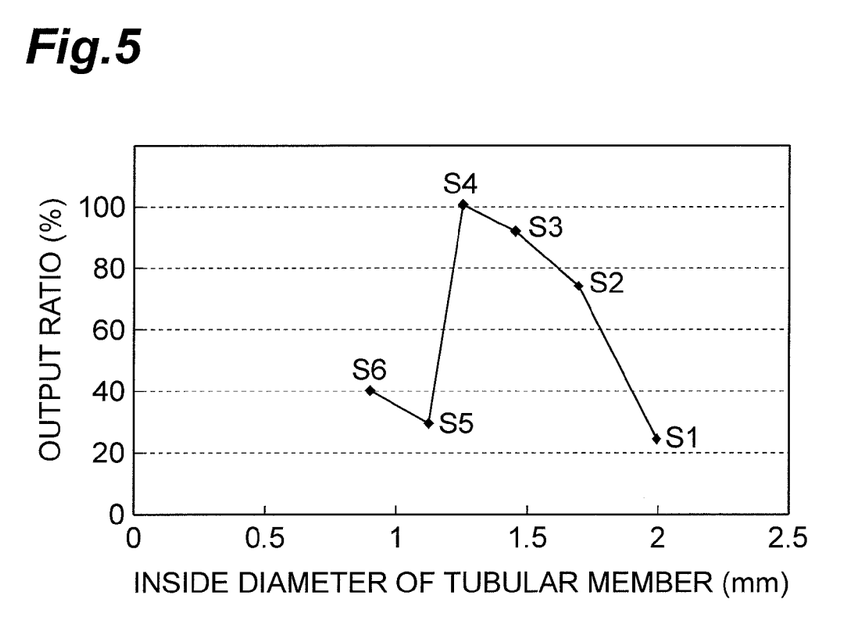
FIG. 5 is a graph showing relations of peak output ratios with respect to the optical output of sample S4 being 100.

The measurement results are provided in FIGS. 4 and 5. FIG. 4 is a graph showing the measurement results and FIG. 5 a graph showing relations of peak output ratios with respect to the optical output of sample S4 with the inside diameter of 1.25 mm being 100, in the measurement results shown in FIG. 4. The samples had the same configuration except for the differences of G (gauge) of their tubular members 5, and the quantum cascade laser 1 used was a pulse operation type quantum cascade laser with the oscillation center wavelength of 5.2 μm. In this measurement, the applied voltage was 19.00 V, the pulse width 300 nsec, the recurrence frequency 111 kHz, and the operating temperature 20.00° C.

It is seen from the measurement results shown in FIGS. 4 and 5 that samples S2-S4 (14-gauge to 16-gauge) with the inside diameter of the tubular member 5 being set in the range of 1.25 to 1.69 mm, i.e., with the cross-sectional area of the tubular member 5 being set in the range of 1.23 to 2.24 mm$^2$ provide greater optical output than samples S1 and S5-S7. When the inside diameter (cross-sectional area) of the tubular member 5 is set in the above-described range in this manner, the quantity of the light guided inside the tubular member 5 increases and the light emitted from the quantum cascade laser 1 is efficiently guided to the infrared detector 7.

Next, the inventors conducted an experiment as described below, using samples S1, S4, and S6, in order to clarify the relationship between the distance L between the rear end face 1b and the opening end 5a, and the optical output. Specifically, the optical output (mV) was further measured with the distance L between the rear end face 1b and the opening end 5a being set to each of 0.25 mm, 0.75 mm, and 1.0 mm, in samples S1, S4, and S6.

Figure 6:
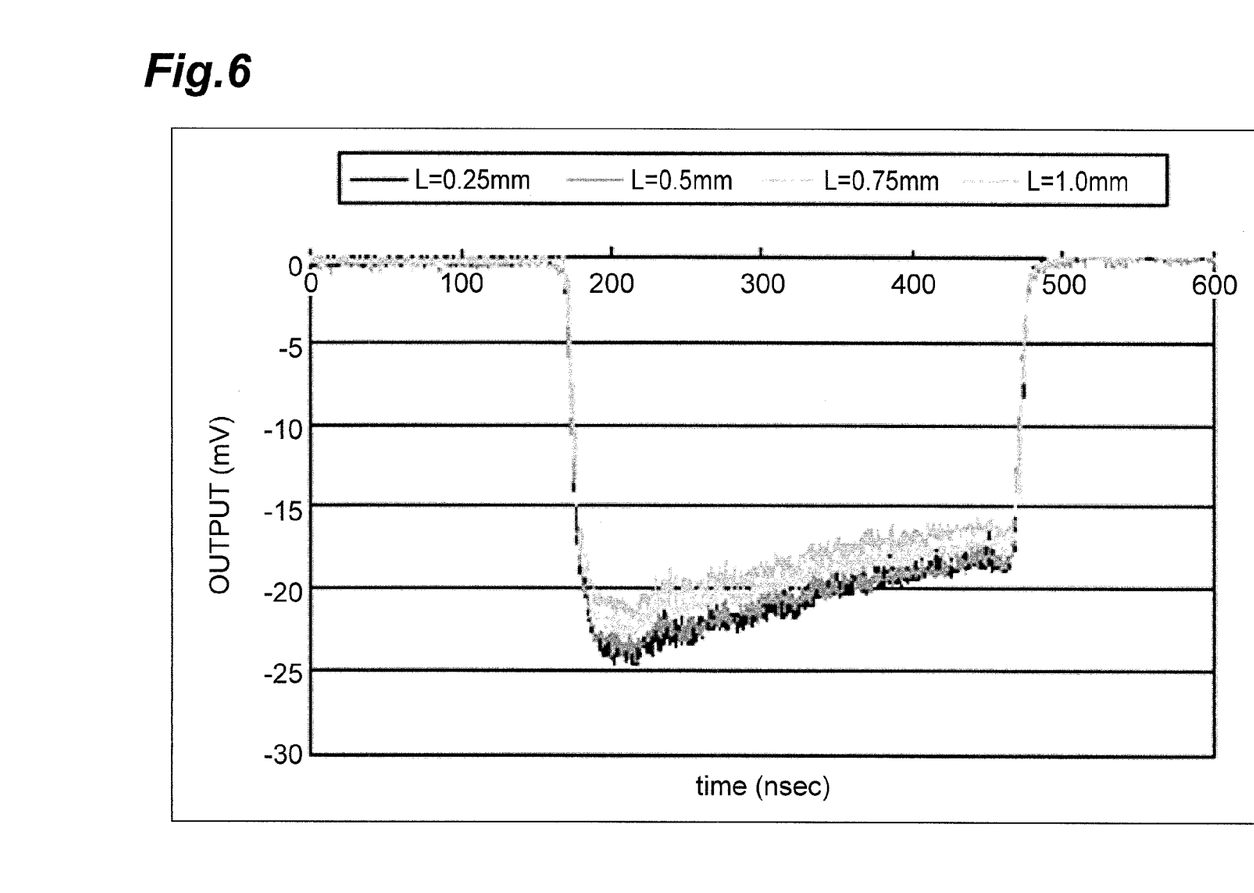
FIG. 6 is a graph showing the measurement results of optical output with the distance between a rear end face and an opening end being set to each of 0.25 mm, 0.5 mm, 0.75 mm, and 1.0 mm, in sample S1.
Figure 7:
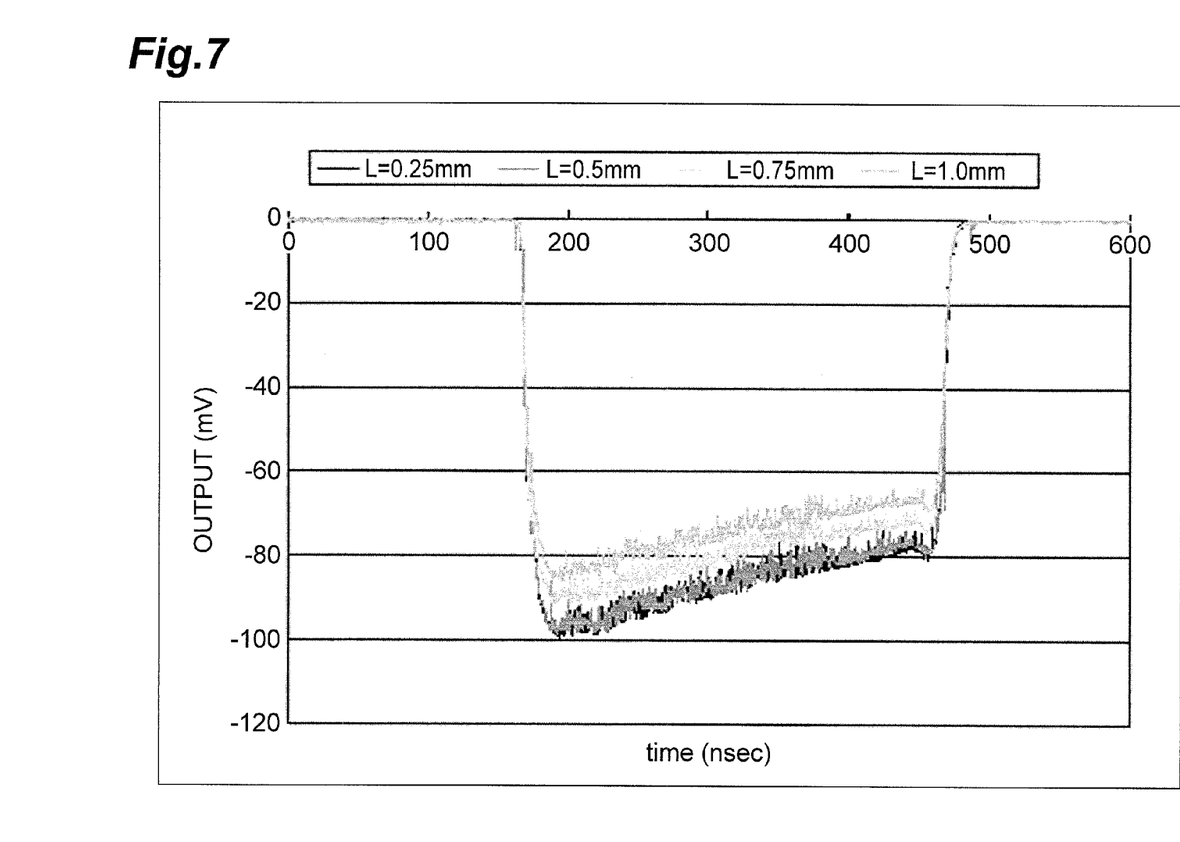
FIG. 7 is a graph showing the measurement results of optical output with the distance between the rear end face and the opening end being set to each of 0.25 mm, 0.5 mm, 0.75 mm, and 1.0 mm, in sample S6.
Figure 8:
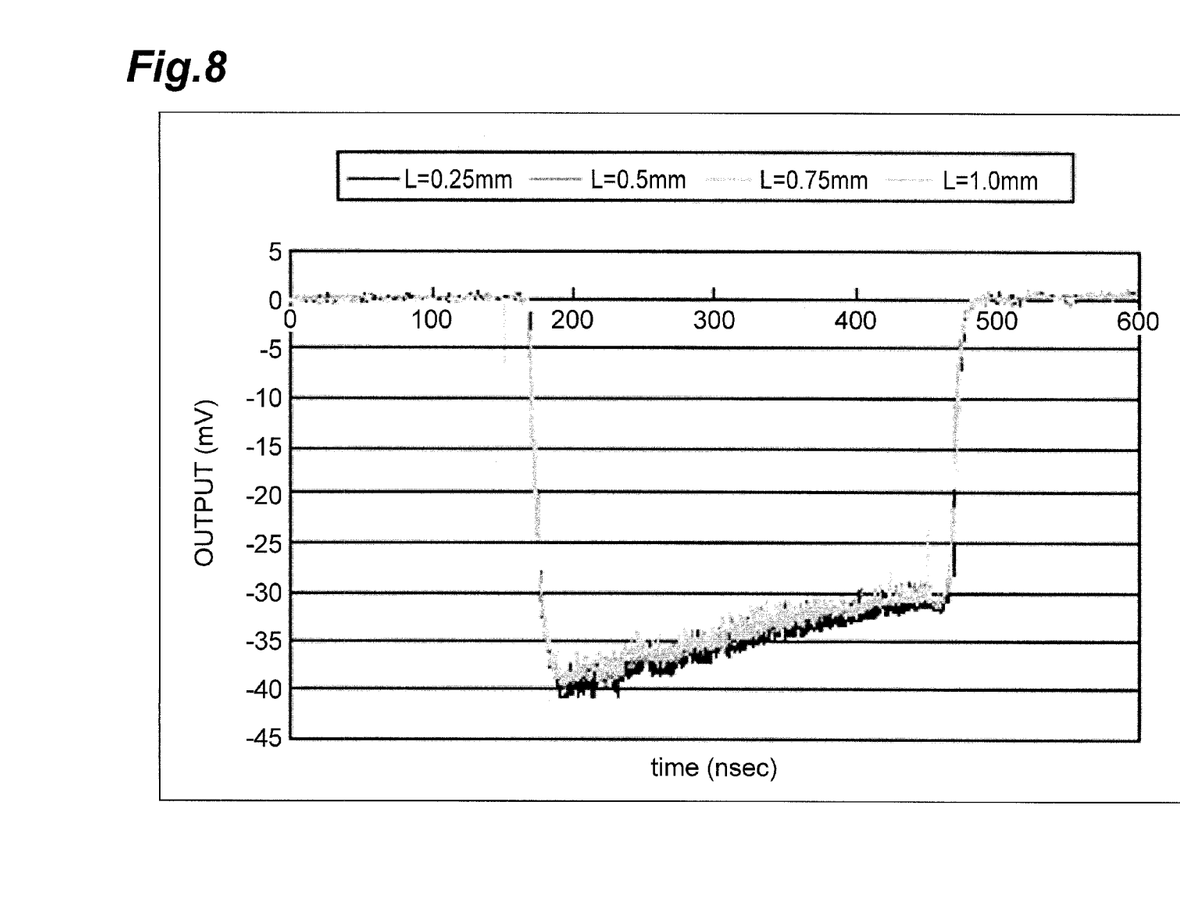
FIG. 8 is a graph showing the measurement results of optical output with the distance between the rear end face and the opening end being set to each of 0.25 mm, 0.5 mm, 0.75 mm, and 1.0 mm, in sample S8.

The measurement results are provided in FIGS. 6 to 8. FIG. 6 is a graph showing the measurement results in sample S1. FIG. 7 is a graph showing the measurement results in sample S4. FIG. 8 is a graph showing the measurement results in sample S6.

It is seen from the measurement results shown in FIGS. 6 to 8 that there is no significant change in optical output, even with differences of the distance L between the rear end face 1b and the opening end 5a. Namely, it is seen that the quantity of the light guided inside the tubular member 5 is virtually independent of the distance between the quantum cascade laser 1 and the tubular member 5.

Next, the inventors conducted an experiment as described below, using samples S1 to S7, in order to clarify the relationship between the oscillation center wavelength and the optical output as quantum cascade laser 1. Specifically, the optical output (mV) was measured using the quantum cascade laser with the oscillation center wavelength at each of 4.3 μm and 8.2 μm as the quantum cascade laser 1, in samples S1 to S7.

Figure 9:
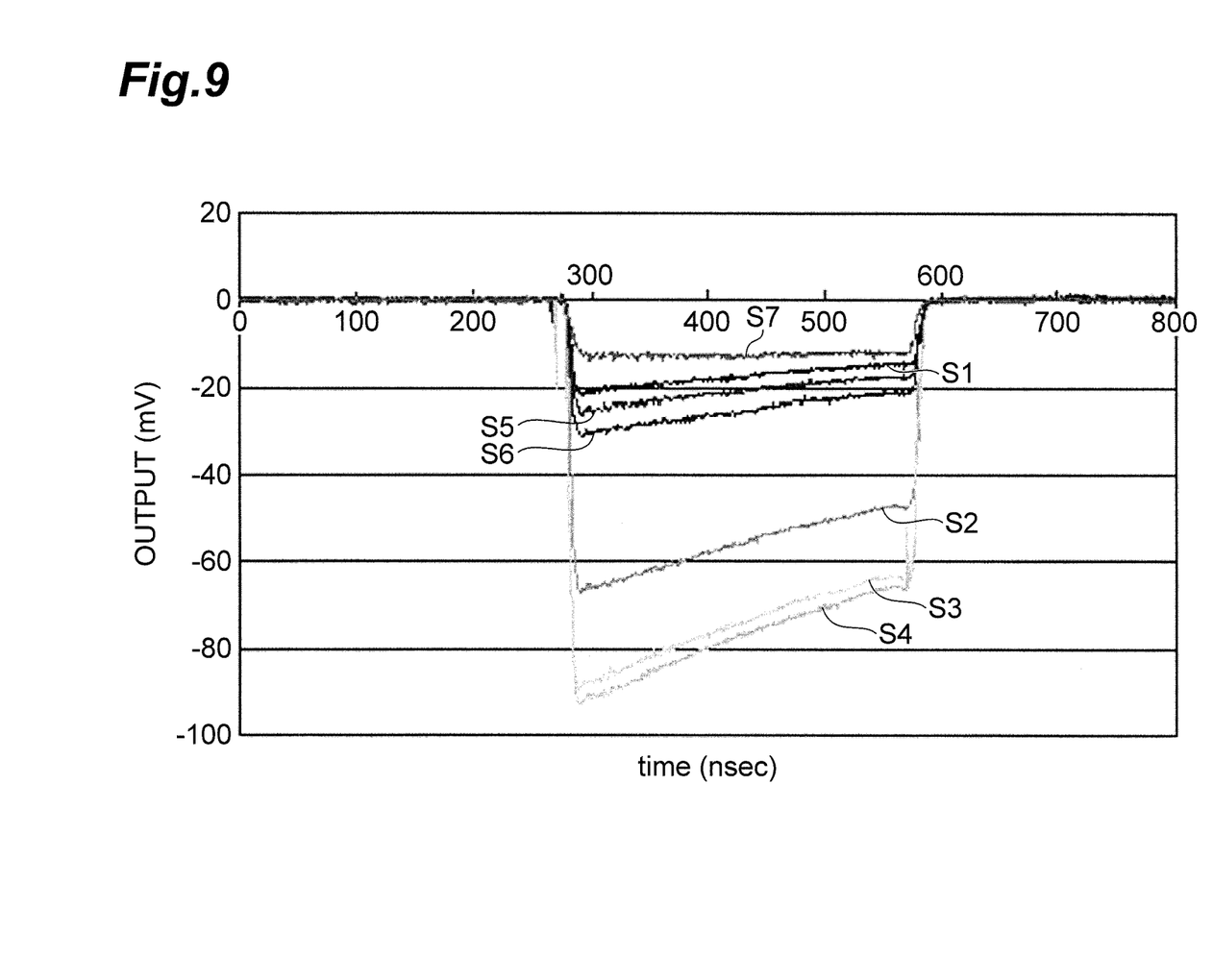
FIG. 9 is the measurement results of optical output in use of the quantum cascade laser with the oscillation center wavelength of 4.3 µm, in samples S1 to S7.
Figure 10:
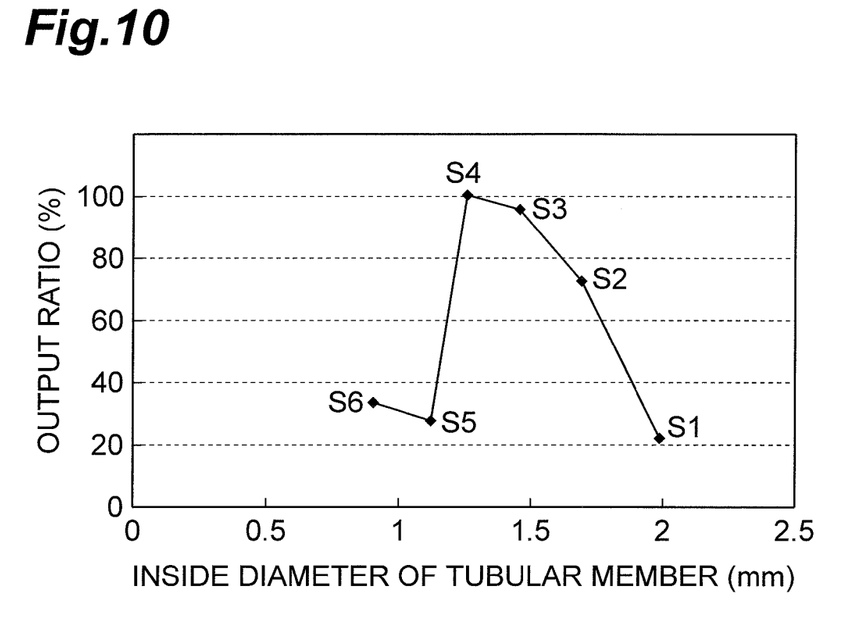
FIG. 10 is a graph showing relations of peak output ratios with respect to the optical output of sample S4 being 100.
Figure 11:
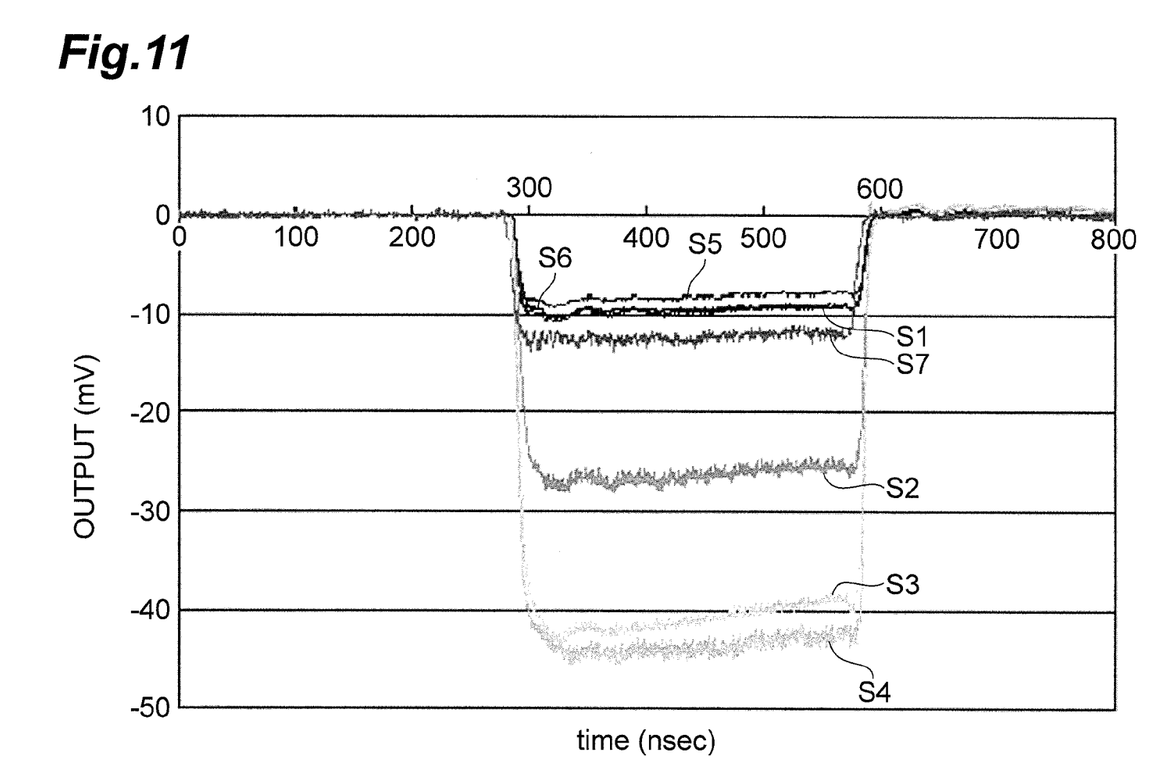
FIG. 11 is the measurement results of optical output in use of the quantum cascade laser with the oscillation center wavelength of 8.2 µm, in samples S1 to S7.
Figure 12:
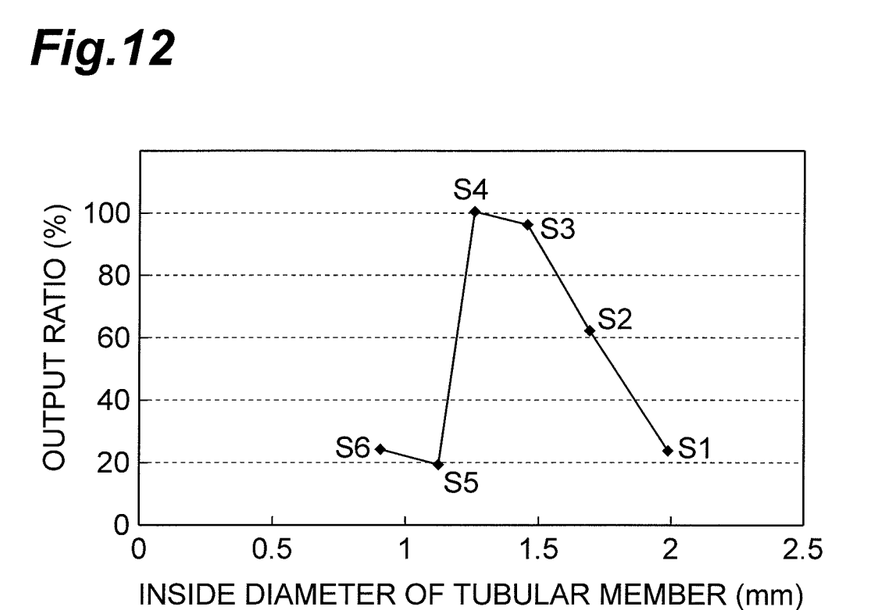
FIG. 12 is a graph showing relations of peak output ratios with respect to the optical output of sample S4 being 100.

The measurement results are provided in FIGS. 9 to 12. FIG. 9 is the measurement results in use of the quantum cascade laser with the oscillation center wavelength of 4.3 μm, and FIG. 10 is a graph showing relations of peak output ratios with respect to the optical output of sample S4 being 100, in the measurement results shown in FIG. 9. FIG. 11 is the measurement results in use of the quantum cascade laser with the oscillation center wavelength of 8.2 μm, and FIG. 12 is a graph showing relations of peak output ratios with respect to the optical output of sample S4 being 100, in the measurement results shown in FIG. 11.

It is seen from the measurement results shown in FIGS. 9 to 12 that even with the difference of oscillation center wavelength of the quantum cascade laser 1, the optical output remains high when the inside diameter of the tubular member 5 is set in the range of 1.25 to 1.69 mm, i.e., when the cross-sectional area of the tubular member 5 is set in the range of 1.23 to 2.24 mm$^2$. Therefore, it is seen that the quantity of the light guided inside the tubular member 5 is virtually independent of the oscillation center wavelength of the quantum cascade laser 1.

The above described the preferred embodiment of the present invention, but it should be noted that the present invention is by no means limited to the above-described embodiment but can be modified in many ways without departing from the scope and spirit of the invention.

In the present embodiment the tubular member 5 has the cylindrical shape, but the tubular member 5 does not have to be limited to this shape and may have a polygonal prism shape. Namely, the cross-sectional shape of the tubular member 5 does not always have to be circular, but may be polygonal.

The tubular member 5 is the metal member made of stainless steel, but, without having to be limited to this, it may be a material with high reflectance for light in the mid-infrared region, e.g., a metal member made of Au, Ag, Cu, or the like. The tubular member 5 itself does not have to be a member with high reflectance for light in the mid-infrared region, but may be the tubular member 5 whose internal surface is coated with a material with high reflectance.

Industrial Applicability

The present invention is applicable to laser modules with the quantum cascade laser.

LIST OF REFERENCE SIGNS

1 . . . quantum cascade laser; 1a . . . front end face; 1b . . . rear end face; 5 . . . tubular member; 5a, 5b . . . opening ends; 7 . . . infrared detector; LM . . . laser module.

The invention claimed is:

1. A laser module comprising:
a fixing member;
a quantum cascade laser emitting mid-infrared light of a wavelength band of 3.8 to 11.5 μm and mounted on the fixing member;
a tubular member having a pair of opening ends and mounted on the fixing member so that one opening end is opposed to a face opposed to an emitting end face of the quantum cascade laser, the tubular member is comprised of stainless steel; and
an infrared detector mounted on the fixing member so as to be opposed to the other opening end of the tubular member,
wherein only the tubular member is arranged in an optical system between the quantum cascade laser and the infrared detector, and
wherein the tubular member has a cross-sectional area set in the range of 1.23 to 2.24 mm$^2$, a quantity of the mid-infrared light guided inside the tubular member is substantially independent of an oscillation center wavelength of the quantum cascade laser.

2. The laser module according to claim 1,
wherein the tubular member has a cylindrical shape and an inside diameter set in the range of 1.25 to 1.69 mm.

3. The laser module according to claim 1,
wherein the quantum cascade laser is mounted on the fixing member through a submount, and the tubular member and the infrared detector are mounted on the fixing member through respective mounting members.

4. A laser module comprising:
a fixing member;
a quantum cascade laser emitting mid-infrared light of a wavelength band of 3.8 to 11.5 μm and mounted on the fixing member;
a tubular member having a pair of opening ends and mounted on the fixing member so that one opening end is opposed to a face opposed to an emitting end face of the quantum cascade laser, the tubular member is comprised of stainless steel; and an infrared detector mounted on the fixing member so as to be opposed to the other opening end of the tubular member, wherein only the tubular member is arranged in an optical system between the quantum cascade laser and the infrared detector, and wherein the tubular member is a 14-gauge, to 16-gauge hollow needle, a quantity of the mid-infrared light guided inside the tubular member is substantially independent of an oscillation center wavelength of the quantum cascade laser.

5. The laser module according to claim 4, wherein the quantum cascade laser is mounted on the fixing member through a submount, and the tubular member and the infrared detector are mounted on the fixing member through respective mounting members.

* * * * *